United States Patent [19]

Neudeck et al.

[11] Patent Number: 4,890,010

[45] Date of Patent: Dec. 26, 1989

[54] MATCHED CURRENT SOURCE SERIAL BUS DRIVER

[75] Inventors: Alexander J. Neudeck, West Lafayette, Ind.; Ernest W. Cordan, Jr., Colorado Springs, Colo.

[73] Assignee: NCR Corporation, Dayton, Ohio

[21] Appl. No.: 288,655

[22] Filed: Dec. 22, 1988

[51] Int. Cl.⁴ ............................................. H03K 17/16
[52] U.S. Cl. ................................ 307/270; 307/350; 307/451; 307/475; 307/263; 370/85.1
[58] Field of Search ............... 307/443, 451, 475, 263, 307/270, 350, 481, 362; 323/315–317; 370/85

[56] References Cited

U.S. PATENT DOCUMENTS

| | | | |
|---|---|---|---|
| 4,320,521 | 3/1982 | Balakrishman et al. | 307/263 X |
| 4,429,384 | 1/1984 | Kaplinsky | 370/85 X |
| 4,613,770 | 9/1986 | Raab | 307/350 |
| 4,614,882 | 9/1986 | Parker et al. | 307/263 X |
| 4,622,482 | 11/1986 | Ganger | 307/263 X |
| 4,659,944 | 4/1987 | Miller, Sr. et al. | 307/362 X |
| 4,739,323 | 4/1988 | Miesterfeld et al. | 340/825.5 |
| 4,814,642 | 3/1989 | Kleks | 307/350 |
| 4,818,901 | 4/1989 | Young et al. | 307/263 X |
| 4,823,029 | 4/1989 | Gabara | 307/270 X |
| 4,827,159 | 5/1989 | Naganuma | 307/443 |

Primary Examiner—David Hudspeth
Attorney, Agent, or Firm—Wilbert Hawk, Jr.; Casimer K. Salys

[57] ABSTRACT

A matched current source bus driver circuit providing time and magnitude matched currents as sources and sinks to a pair of serial bus lines. A reference current path is established in transistors which are structurally mirrored to the devices sourcing and sinking bus line currents. Time regulated switching of the reference current ensures RF suppression while maintaining the match of the source and sink current sources driving the bus. Selective decoupling during a loss of circuit ground condition eliminates spurious injection of current into either bus line.

12 Claims, 3 Drawing Sheets

MATCHED CURRENT SOURCE SERIAL BUS DRIVER

BACKGROUND OF THE INVENTION

The present invention relates to an electronic circuit for communicating data onto a bus. More particularly, the invention involves an electronic transmitter circuit which utilizes matched current sources to synchronously drive a pair of serial bus lines.

The circuit of the present invention is particularly suited to the needs of a multiplexed bus operating in an automotive vehicle environment. In such environment, the circuit generates digital signals which are driven onto a complementary pair of bus lines. In keeping with system design constraints, the circuit output is functionally equivalent to a matched pair of synchronized current sources respectively pushing and pulling the pair of bus lines. In further keeping with the mandates of the application, the circuit is configured with current drivers which minimize bus radio frequency (RF) radiation and includes features suitable to detect and appropriately respond in a ground loss operating environment.

The basic requirements of the composite system to which the present circuit relates have been the subject of numerous publications. For example, some requirements are set forth in Engineering Standard No. PF-8219, issued by Chrysler Corporation in approximately June, 1986 under the title "Integrated Circuit—Universal C²D Differential Serial Bus Interface". Further early development is set forth in the article by Miesterfeld, entitled "Chrysler Collision Detection (C²D)—A Revolutionary Vehicle Network", which appeared as *SAE Technical Paper Series*, 860389, dated Feb. 24-28, 1986. A recent discussion of the operational system requirements appeared in the article by Fassnacht et al. entitled "Chrysler Collision Detection (C²D TM) Bus Interface, Integrated Circuit User Manual" which was published as *SAE Technical Paper Series*, 880586, in approximately Feb. 29-Mar. 4, 1988. The requirements of the operating environment are also extensively documented in recently issued U.S. Pat. No. 4,739,323, the subject matter of which is now incorporated by reference.

What remains as undefined within the various references is the implementation of a transmitter capable of generating the synchronous and matched current sources with suppressed RF generation and ground loss operation capability. Moreover, it is particularly important that the transmitter circuit be suitable for fabrication as a CMOS type integrated circuit, in that the various transceiver (transmitter/receiver) functions will eventually be merged onto a common semiconductor chip. Other aspects of the serial data bus operating environment to which this present transmitter is peculiarly suited are detailed in the various references identified hereinbefore.

The application of the current mirrors to field effect transistor integrated circuits per se is relatively well-known. For instance, a sensing circuit with multiple current mirror connected field effect transistors is described in U.S. Pat. No. 4,488,065.

SUMMARY OF THE INVENTION

The serial bus driving transmitter of the present invention provides a pair of current sources matched both as to current magnitude and to synchronization during enablement and disablement. The first current source drives the high side bus line using the supply voltage, while the second current source sinks the low side bus line in the course of pulling the line toward ground potential. The pulling transistors in both current sources are configured to operate as current mirrors referenced to structurally matching devices in an independent reference current path. The reference current is resistively regulated, selectively enabled, and connected to flow through a series wired pair of current mirror reference transistors, ensuring a magnitude and time match of the current mirror reference current. In this way, the mirrored current sourcing and current sinking transistors provide precisely matched current levels through the serial bus. The current mirror circuits are further refined to include pull-up and pull-down devices which ensure full disablement, as well as matching resistive elements to offset the effects of channel length modulation in the mirrored transistors.

The sourcing and sinking currents driving the serial bus are enabled coincidence with the reference current path. The rate of change of the reference current is constrained to suppress bus radio frequency emissions through the use of an RC circuit between the digital format input signal and the transistor enabling the reference current flow. Switching delays are minimized by biasing the reference current control transistor near its conduction level while enabling pull-up and pull-down devices in parallel with the respective reference path current mirror transistors to avoid leakage currents. The current sources also include elements which disable conduction therethrough in the event of a ground loss condition.

These and other features of the invention will be more clearly understood and appreciated upon considering the detailed description of a preferred embodiment as follows hereinafter.

DESCRIPTION OF THE PREFERRED EMBODIMENT

Figure 1:
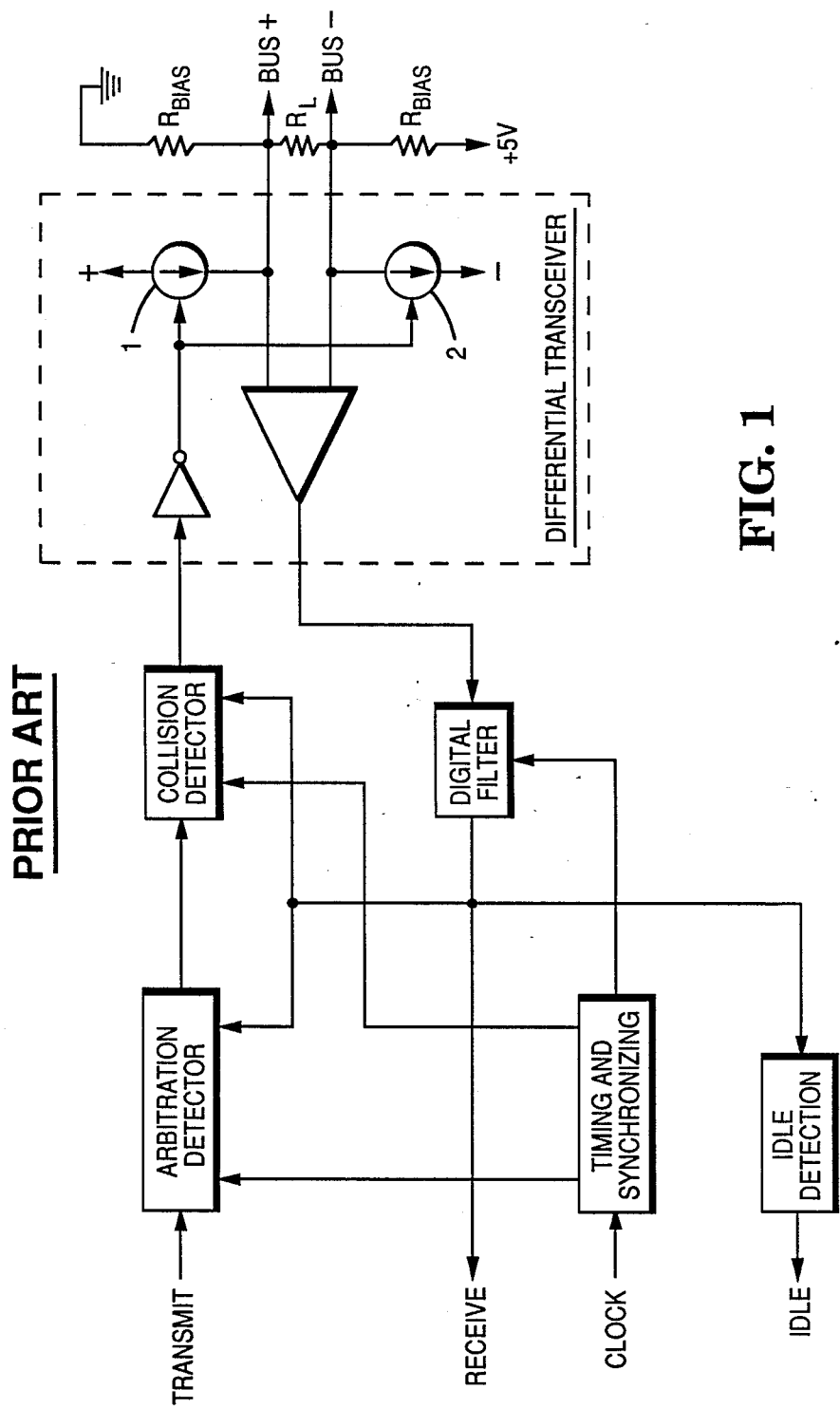
FIG. 1 is a schematic showing by block diagram the representative operating environment as defined by the prior art.

The present invention as preferably embodied is peculiarly suited to the automotive operating environment as described in U.S. Pat. No. 4,739,323, incorporated by reference hereinbefore. A segment of such system is illustrated in FIG. 1. The present invention involves a part of the differential transceiver block which interfaces to the serial bus, the bus consisting of lines BUS+ and BUS−, the whole block including circuitry to both transmit and receive data over the bus. According to this system architecture, digital format output signals conveyed to the differential transceiver are used to equally and synchronously drive current source 1 and current sink 2. A balance of the source and sink currents produces a voltage across the equivalent load resistance $R_L$ of bus lines. The bias resistors $R_{BIAS}$ pull both bus lines to a nominal level of 2.5 volts when all current generators driving the bus are disabled.

Figure 2:
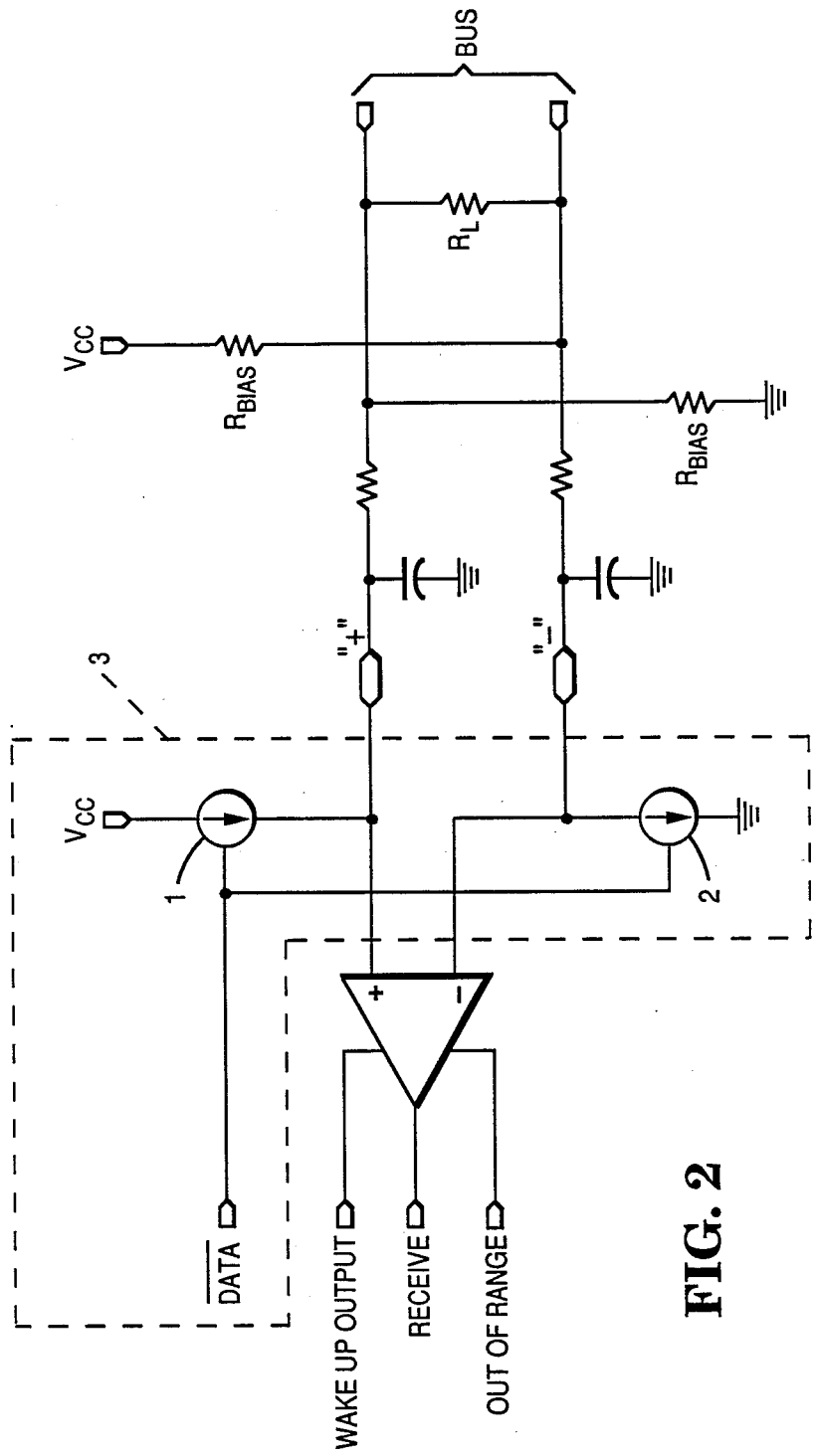
FIG. 2 is a schematic particularizing the bus load of contemplated operating environment.

The differential transceiver and related bus elements are further detailed in FIG. 2. The numerous resistive and capacitive elements represent the equivalent load exhibited by the bus, and upon consideration confirm the need for symmetry and synchronism in the operations of current sources 1 and 2.

Figure 3:
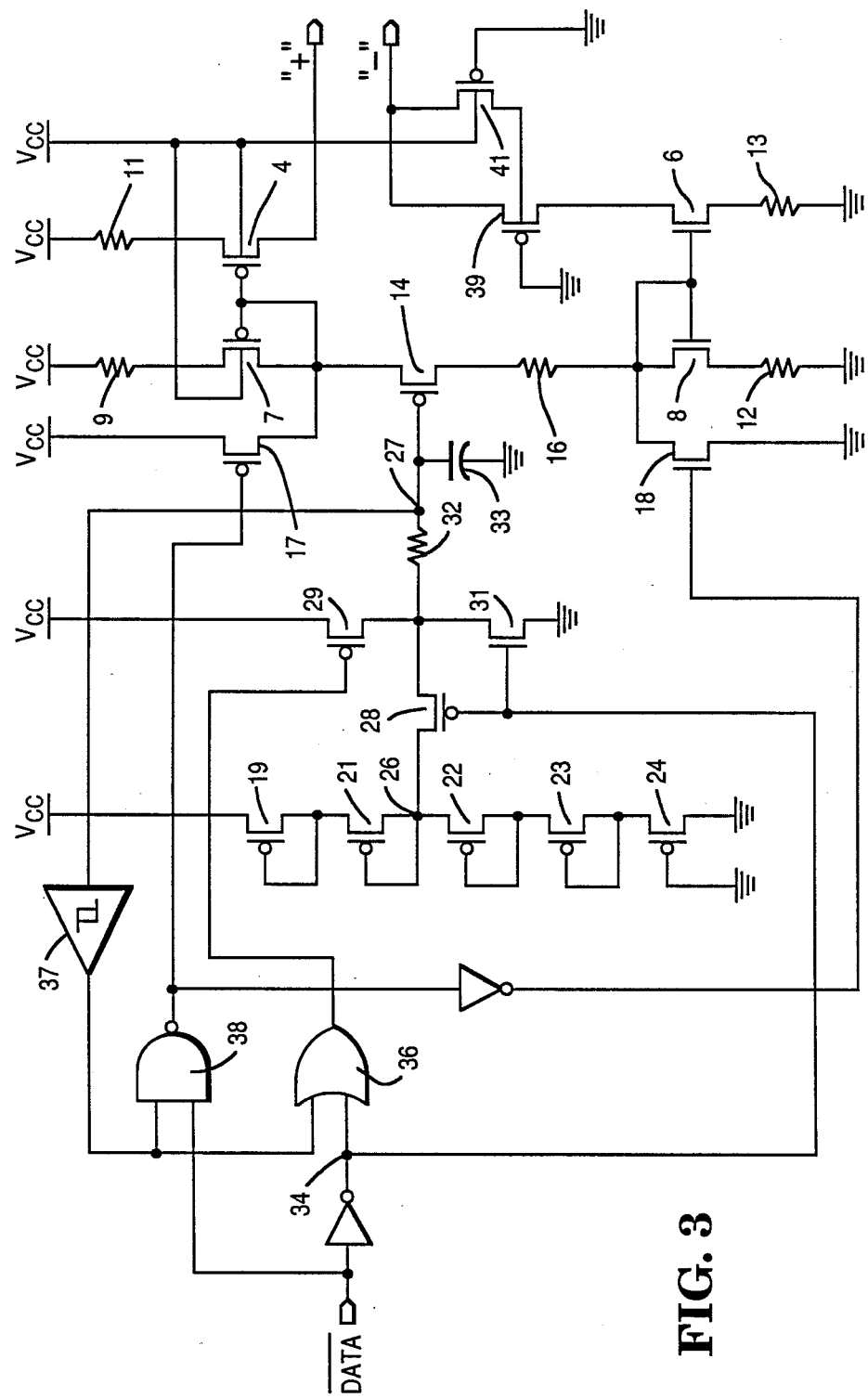
FIG. 3 is a schematic illustrating a preferred arrangement of the present invention to provide current sourcing and sinking in according with the application depicted in FIG. 2.

The schematic illustrated in FIG. 3 corresponds to the transmitter 3 from the composite transceiver depicted in FIG. 2 of the drawings. The Current source 1 and current sink 2 are respectively connected to the high and low supply voltages. Current drive output signals at the "+" and "−" nodes of the transmitter are responsive to digital format DATA/signals.

The matched current source serial bus driver embodied in FIG. 3 includes features to ensure a match of the current levels in the complementary current sources, features to synchronize the operation of the sources, features to control the rate of current change in limiting radio frequency radiation, and features to avoid spurious leakage currents onto the bus lines in the event of a circuit ground loss. The implementation of these features by way of electronic devices will be considered individually.

The current source for the "+" side of the bus is established by p-channel transistor 4, while the complementary current sink connected to the "−" side of the bus is established by n-channel transistor 6. The gate voltage on transistor 4 is matched in magnitude to that on the gate electrode of structurally matched current mirror reference transistor 7, producing matching currents in such current mirror connected transistors 4 and 7. Similarly, the magnitude of current flowing through transistor 6 matches the magnitude of current flowing through structurally matched current mirror reference transistor 8. Resistors 9 and 11, as well as resistors 12 and 13, are matched in respective pairs, with their functions described hereinafter. Consequently, the reference current flowing from $V_{CC}$ through serially connected resistor 9, mirror transistor 7, switching transistor 14, resistor 16, mirror transistor 8 and resistor 12 is identically reproduced in mirror connected source transistor 4 and mirror connected sink transistor 6.

The function of switch transistor 14 is to selectively enable the reference current, and thereby produce in synchronism the selective enablement, or disablement, of current in source transistor 4 and current sink transistor 6. Resistor 16 is used to adjust the magnitude of the current in the reference path. Resistors 9 and 12 also affect the magnitude of the reference current, but to a significant lesser degree. P-channel pull-up transistor 17 and n-channel pull-down transistor 18 are simultaneously enabled soon after switching transistor 14 is disabled to ensure that current source transistor 4 and current sink transistor 6 are fully disabled when the reference path current is in an off state. As a consequence of such structural arrangement, the sourcing current furnished to the "+" line of the bus is matched to the sinking current pulled from the "−" line of the bus, both in magnitude and in time synchronization.

The matched pair of resistors 9 and 11, connected to the respective source electrodes of p-channel transistors 7 and 4, compensate for the transistor channel length modulation effects. In the case of current source transistor 4, the effective channel length increases as the voltage across the transistor decreases with bus loading effects. Such effective channel length increase causes an associated drop in the magnitude of the current furnished to the bus. Series resistor 11 produces an effective offsetting increase of the potential on the source electrode of transistor 4. Given that transistor 4 is mirror connected to its reference transistor 7, which transistor 7 is not subject to current modulation, the offsetting source electrode voltage serves to minimize the current changes attributable to channel modulation effects in transistor 4. The same compensation configuration is used for the n-channel current sinking transistor 6, the matched resistors 12 and 13 here being selected to offset the channel modulation effect in n-channel transistor 6.

The channel length modulation effect also comes into consideration during the specification of the width-/length (W/L) ratio of current sourcing transistor 4 and current sinking transistor 6. As the effective impedance of the bus changes, the individual magnitudes of the voltages across the transistors 4 and 6 will differ. Current mismatches attributable to differences in voltage induced channel length modulation can be decreased through a judicious choice of transistor channel W/L dimensions. Namely, if the channel length L is increased, the relative magnitude of channel length modulation voltage can be decreased. Unfortunately, the use of long channels for transistor 4, 6, 7 and 8 must coexist with the need for significant W/L ratio to attain required current magnitudes. Simultaneous satisfaction of both objectives can consume significant area on any semiconductor chip. The tradeoff between semiconductive chip area and current matching precision must be balanced by the circuit designer in the context of factors such as power supply noise voltage ranges, device operating temperatures, fabrication yield, and fabrication process tolerances.

The circuit in FIG. 3 includes a set of five p-channels transistors 19, 21, 22, 23 and 24 connected in series to form a voltage divider. The divider provides a bias voltage on node 26 approximately two thresholds below the supply voltage $V_{CC}$. The bias voltage preconditions node 27 near the threshold of switching transistor 14 when transistor 14 is disabled. The purpose of the bias voltage is to minimize time delays between the DATA/signal and the related initiation of reference current flow through transistor 14 and enablement of current source and current sink transistors 4 and 6. The bias voltage is conveyed through p-channel transistor 28. Note that any leakage current through transistor 14 attributable to such biasing is shunted around reference path mirror transistor 7 and 8 by transistors 17 and 18.

Transistors 29 and 31 pull node 27 toward the supply voltage $V_{CC}$ or ground potential at a rate defined by the RC time constant of resistor 32 and capacitor 33. Note that biasing transistor 28 and pull-down transistor 31 operate in the alternative but in synchronism with the signal DATA on node 34. The DATA signal also shares in the control of pull-up transistor 29, following a logic combination in OR gate 36 with the feedback signal from Schmitt trigger 37. Schmitt trigger 37 is responsive to the RC delayed voltage on node 27.

NAND gate 38 combines the output from Schmitt trigger 37 with the DATA/signal to establish the conductive states of shunting transistors 17 and 18. As configured, transistors 17 and 18 are enabled when DATA/signal is active nigh and node 27 has approached the supply $V_{CC}$ sufficiently to enable Schmitt trigger 37. Under such conditions current source 4 and current sink 6 are completely disabled. When DATA/- transitions from the active high to an inactive low state, NAND gate 38 immediately disables the shunting transistors 17 and 18. This immediate change allows the reference path current to increase in relation to the RC time constant effects on the gate electrode of switching transistor 14.

In the event a loss of circuit ground condition occurs, the potential of the bus moves negative with respect to all circuit potentials. For the circuit embodied in FIG. 3, transistors 39 and 41 become disabled unless the "−" bus potential is at least one threshold above the ground potential of the circuit. Consequently, a loss of ground condition disables transistor 39 and 41. Current source transistor 4 is also off during a loss of ground condition, by the absence of a relative drive potential on the gate electrode. Thereby, the embodying circuit completely disables both the current source and current sink drive paths from the bus during loss of ground. This decoupling ensures that stray leakage currents are not injected by the circuit into either of the serial bus lines during such fault.

The operation of the circuit is best understood by considering the two steady-state conditions and the two transitions therebetween. Consider as a starting point, the post-transition or steady-state interval during which the DATA/signal is active high. At this time, node 27 is high, switch transistor 14 is disabled, and the pair of pulling transistors 17 and 18 are fully disabling both the current sourcing and current sinking functions of the circuit. Concurrently, transistor 28 is enabled to pass bias voltage from the p-channel voltage divider to node 27.

The transition of the DATA/signal from the high state to a low state immediately disables transistors 17, 18 and 28, while simultaneously enabling transistor 31, through action on NAND gate 38 and node 34. Transistor 31 pulls node 27 toward ground at a rate determined by the time constant of resistor 32 and capacitor 33, the values of 32 and 33 being selected by the designer to minimize radio frequency transmissions from the bus. As the voltage on node 27 decreases below the threshold of Schmitt trigger 37, the signal from Schmitt trigger 37 to OR gate 36 and NAND gate 38 switches low. The outputs of gates 36 and 38 do not change. Soon after the high to low transition of the DATA/signal, node 27 is pulled sufficiently low to enable switch transistor 14 and establish a reference path current through mirror transistors 7 and 8. The steady-state condition for the low DATA/signal is attained when node 27 reaches ground potential and switching transistor 14 is fully enabled.

The other transition, whereby the DATA/signal changes from the low steady-state level to a high level, produces an immediate disablement of transistor 31, a concurrent enablement of transistors 28 and 29, and the pulling of node 27 toward the supply voltage $V_{CC}$. The presence of Schmitt trigger 37 between node 27 and NAND gate 38 delays the enablement of shunting transistors 17 and 18 until the voltage on node 27 rises to suitably disable switching transistor 14. As was true for the other transition, the rate of change of voltage of node 27 is determined by the RC time constant of resistor 32 and capacitor 33. When the voltage on node 27 switches Schmitt trigger 37 to a high output state, NAND gate 38 enables shunting transistors 17 and 18 to completely disable current source transistor 4 and current sink transistor 6. OR gate 36 responds to the output from Schmitt trigger 37 by disabling transistor 29, so that the steady-state bias voltage on node 27 is thereafter established by node 26 of the voltage divider.

Other system features, such as OVERRIDE and BUS WAKEUP signal functions can be readily integrated into the circuit in FIG. 3. For instance, pulling/shunting transistors 17 and 18 can be driven directly to disable the current source and sink functions, without regard to the DATA/state and without upsetting the states or transition rates present on node 27. A DATA/low BUS WAKEUP signal can be generated by enabling the current source to drive the "+" line of the bus while disabling the current sink function using pull-down transistor 18.

The matched current source serial bus driver circuit as embodied in FIG. 3 thereby provides time synchronous operation of current source and current sink elements, a matching of the sourcing and sinking current levels, minimum propagation delay, integrated circuit ground loss isolation capability, controllable rate of a change of current for RF suppression, and foremost, precisely matched levels of source and sink current over a broad bus load operating range.

It will be understood by those skilled in the art that the embodiments set forth hereinbefore are merely exemplary of the numerous arrangements by which the invention may be practiced, and as such may be replaced by equivalents without departing from the invention which will now be defined by appended claims.

We claim:

1. A CMOS integrated circuit bus driving transmitter, comprising:
   a first current path between high and low supply voltages including a serial connection of a p-channel reference transistor and a n-channel reference transistor;
   a first current source connected to conduct between the high supply voltage and a high line of the bus in matched response to a control signal shared with the p-channel reference transistor;
   a second current source connected to conduct between the low supply voltage and a low line of the bus, complementary to the high line of the bus, in matched response to a control signal shared with the n-channel reference transistor; and
   means for selectively enabling current flow in the first path at a controlled rate of change.

2. The apparatus recited in claim 1, wherein:
   the first current source is a p-channel transistor which is dimensionally matched and connected to the p-channel reference transistor to operate as a current mirror; and
   the second current source is a n-channel transistor which is dimensionally matched and connected to the n-channel reference transistor to operate as a current mirror.

3. The apparatus recited in claim 2 further comprising:
   first and second functionally matched resistive elements connected respectively between the high supply voltage and the p-channel reference transistor and the p-channel first current source transistor; and
   third and fourth functionally matched resistive elements connected respectively between the low supply voltage and the n-channel reference transistor and the n-channel second current source transistor.

4. The apparatus recited in claim 3, further comprising:

means for detecting when the voltage on the low line of the bus is in the range of the low supply voltage or below, and disabling current flow through the n-channel second current source responsive thereto.

5. The apparatus recited in claim 4, further comprising in the first current path a fifth resistive element suitable to establish the magnitude of the current in the first current path.

6. The apparatus recited in claim 5, wherein the means for selectively enabling current flow is a switched transistor connected in series with the fifth resistive element.

7. The apparatus recited in claim 2, further comprising:
   first switching means for selectively pulling the p-channel reference transistor to the level of the high supply voltage;
   second switching means for selectively pulling the n-channel reference transistor to the level of the low supply voltage; and
   logic for synchronizing the operations of the means for selectively enabling current flow in the first path, the first switching means, and the second switching means.

8. The apparatus recited in claim 6, further comprising:
   first switching means for selectively pulling the p-channel reference transistor to the level of the high supply voltage;
   second switching means for selectively pulling the n-channel reference transistor to the level of the low supply voltage; and
   logic for synchronizing the operations of the means for selectively enabling current flow in the first path, the first switching means, and the second switching means.

9. The apparatus recited in claim 7, wherein the logic for synchronizing is threshold responsive to a control signal driving the means for selectively enabling current flow in the first path, to enable pulling when the control signal substantially disables the means for selectively enabling.

10. The apparatus recited in claim 8, wherein the logic for synchronizing is threshold responsive to a control signal driving the means for selectively enabling current flow in the first path, to enable pulling when the control signal substantially disables the means for selectively enabling.

11. The apparatus recited in claim 9, wherein the first switching means includes a p-channel transistor and the second switching means includes an n-channel transistor.

12. The apparatus recited in claim 10, wherein the first switching means includes a p-channel transistor and the second switching means includes an n-channel transistor.

* * * * *